United States Patent
Park et al.

(10) Patent No.: US 9,922,728 B2
(45) Date of Patent: Mar. 20, 2018

(54) MEMORY DEVICE

(71) Applicant: SK hynix Inc., Gyeonggi-do (KR)

(72) Inventors: Min-Su Park, Gyeonggi-do (KR);
Jae-Il Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 35 days.

(21) Appl. No.: 15/066,633

(22) Filed: Mar. 10, 2016

(65) Prior Publication Data

US 2017/0069398 A1   Mar. 9, 2017

(30) Foreign Application Priority Data

Sep. 9, 2015   (KR) .................. 10-2015-0127457

(51) Int. Cl.
| | |
|---|---|
| G11C 29/56 | (2006.01) |
| G11C 29/52 | (2006.01) |
| G11C 11/406 | (2006.01) |
| G11C 29/50 | (2006.01) |

(52) U.S. Cl.
CPC ............ G11C 29/52 (2013.01); G11C 11/406 (2013.01); G11C 29/50016 (2013.01); *G11C 2211/4062* (2013.01)

(58) Field of Classification Search
USPC .................. 714/718, 773, 719, 52
See application file for complete search history.

(56) References Cited

U.S. PATENT DOCUMENTS

| | | | | |
|---|---|---|---|---|
| 4,935,900 | A * | 6/1990 | Ohsawa ................ | G11C 11/406 365/201 |
| 8,120,960 | B2 * | 2/2012 | Varkony ................ | G11C 5/145 365/185.16 |
| 2009/0070637 | A1* | 3/2009 | Van Acht ............ | G06F 11/1068 714/52 |
| 2011/0179322 | A1* | 7/2011 | Lee ..................... | G06F 11/1048 714/719 |
| 2015/0154069 | A1* | 6/2015 | Tuers .................. | G06F 11/1072 714/773 |

FOREIGN PATENT DOCUMENTS

| | | |
|---|---|---|
| KR | 1020130117198 | 10/2013 |
| KR | 1020150017276 | 2/2015 |
| KR | 1020170023249 | 3/2017 |

* cited by examiner

*Primary Examiner* — Fritz Alphonse
(74) *Attorney, Agent, or Firm* — IP & T GROUP LLP

(57) ABSTRACT

A memory device may include a plurality of memory cells; and an error detection unit suitable for latching first read data of one or more memory cells selected from the plurality of memory cells after refreshing the selected memory cells, in a first phase, and suitable for detecting errors of the selected memory cells before refreshing the selected memory cells, in a second phase.

14 Claims, 8 Drawing Sheets

MEMORY DEVICE

CROSS-REFERENCE TO RELATED APPLICATIONS

The present application claims priority of Korean Patent Application No. 10-2015-0127457, filed on Sep. 9, 2015, which is incorporated herein by reference in its entirety.

BACKGROUND

1. Field

Exemplary embodiments of the present invention relate to a memory device.

2. Description of the Related Art

Memory devices may include a plurality of memory cells, each of which includes a cell transistor serving as a switch and a cell capacitor for storing a charge (data). Data of a memory cell may be determined as 'high' (logic 1) or 'low' (logic 0) depending on the charge stored in the cell capacitor of the memory cell, that is, whether a terminal voltage of the cell capacitor is high or low.

In principle, maintaining data stored in a memory cell as an accumulated charge in a cell capacitor, requires no power consumption. However, in practice, an initial charge stored in a cell capacitor may degrade overtime due to a leakage current caused, for example, near a PN junction of a MOS transistor, which in turn may cause a data loss. Furthermore, as the degree of integration of memory devices continues to increase and the width of line patterns (or critical dimension) decreases, the capacitance of a cell capacitor is reduced as compared with the capacitance of a bit line capacitor, so that a voltage difference for distinguishing data stored in the memory cell becomes smaller. As a result, there is an increased likelihood that a 1-bit failure occurs. Such 1-bit failure is commonly referred to as an intermittent tWR failure (hereinafter, also referred to as an intermittent failure).

An intermittent failure does not occur continuously in a specific cell but may occur rather irregularly, hence addressing such a failure may be problematic.

For example, a memory device such as a DRAM may perform a typical refresh operation on a constant cycle. Since an intermittent failure may occur during a refresh operation, it is difficult to prevent an intermittent failure through a typical refresh operation. Furthermore, even though a failed cell detected through a test in a production stage of a memory device may be repaired with a redundancy cell, it may be difficult to prevent an intermittent failure through conventional test and repair since an intermittent failure may also occur in a memory cell which is not detected as a failed cell.

SUMMARY

Various embodiments are directed to a memory device which detects and corrects intermittent failure of memory cells during own operation.

In an embodiment a memory device may include a plurality of memory cells; and an error detection unit suitable for latching first read data of one or more memory cells selected from the plurality of memory cells after refreshing the selected memory cells, in a first phase, and suitable for detecting errors of the selected memory cells before refreshing the selected memory cells, in a second phase.

In another embodiment, a memory device may include: a plurality of memory cells; a refresh counter suitable for generating a refresh address; a detection counter suitable for generating row and column detection addresses; a period signal generation unit suitable for sequentially activating first and second period signals in a period when the refresh address and the row detection address are substantially equal to each other; and an error detection unit suitable for latching first read data of first memory cells corresponding to the row and column detection addresses among the plurality of memory cells in response to a refresh command when the second period signal is activated in a first phase, and suitable for detecting errors of the first memory cells in response to the refresh command using second read data of the first memory cells when the first period signal is activated in a second phase.

In accordance with the present technology, intermittent fail of a memory cell is detected during an operation of a memory device and is corrected, so that it is possible to allow the memory device to normally operate even though the intermittent fail occurs.

DETAILED DESCRIPTION

Figure 1:
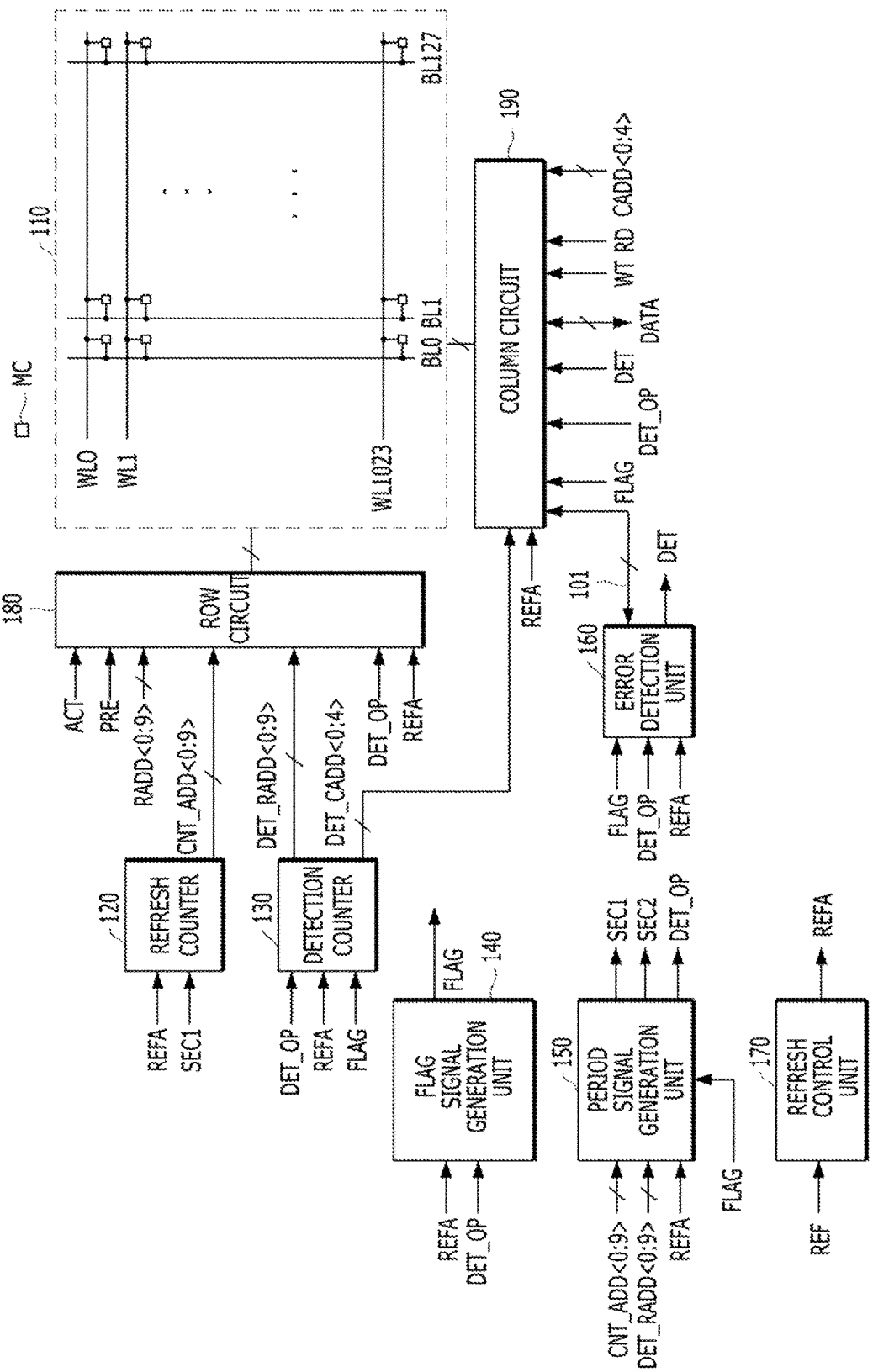
FIG. 1 is a configuration diagram of a memory device, according to an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

A detection operation may include detecting an intermittent failure of a memory device. A detection operation may include correcting an intermittent failure of a memory device.

In an embodiment, a detection operation may include first and second sub-operations. A first sub-operation may include a first reading of data of one or more selected memory cells from a plurality of memory cells and latching the first read data. The second sub-operation may include a second reading of the data of the same one or more selected memory cells, and comparing the second read data from the second sub-operation with the latched data form the first sub-operation for detecting an intermittent failure. The second sub-operation may further include correcting the one or more memory cells for which an intermittent failure has been detected.

FIG. 1 is a configuration diagram of a memory device, according to with an embodiment of the present invention.

Referring to FIG. 1, the memory device may include a cell array 110, a refresh counter 120, a detection counter 130, a flag signal generation unit 140, a period signal generation unit 150, an error detection unit 160, a refresh control unit 170, a row circuit 180, and a column circuit 190.

The cell array 110 may include a plurality of rows WL0 to WL1023 (word lines), a plurality of columns BL0 to BL127 (bit lines), and a plurality of memory cells MC coupled between the word lines and the bit lines. The number of rows, columns, and memory cells may vary.

The refresh counter 120 may perform a counting operation to whenever a refresh signal REFA is activated. For example, the refresh counter 120 may generate counting addresses CNT_ADD<0:9> and may increase the counting addresses CNT_ADD<0:9> by 1 whenever the refresh signal REFA is activated. Increasing the counting addresses CNT_ADD<0:9> by 1 means that if, for example, a $K^{th}$ word line is selected this time, the counting addresses CNT_ADD<0:9> are changed so that a $K+1^{th}$ word line will be selected next time. However, in a period in which the counting addresses CNT_ADD<0:9> and row detection addresses DET_RADD<0:9> are substantially equal, a first period signal SEC1 is activated and the refresh counter 120 may perform no counting in response to the first period signal SEC1, even though the refresh signal REFA is activated. That is, when the first period signal SEC1 has been activated, the refresh counter 120 may skip the counting.

The detection counter 130 may generate row and column detection addresses DET_RADD<0:9>, DET_CADD<0:4> for selecting memory cells for performing a detection operation, from the plurality of memory cells MC of the cell array 110. Whenever a detection operation is completed, the detection counter 130 may increase the row detection addresses DET_RADD<0:9> or the column detection addresses DET_CADD<0:4>. When the row detection addresses DET_RADD<0:9> or the column detection addresses DET_CADD<0:4> reach an end value, the detection counter 130 may repeat the counting from an initial value. The completion of a detection operation may represent that first and second sub-operations have been sequentially completed once with respect to selected memory cells.

In an embodiment, whenever a detection operation is completed, the detection counter 130 may increase the column detection addresses DET_CADD<0:4>. When the detection operation is completed at the end value of the column detection addresses DET_CADD<0:4> (for example, a maximum value), the detection counter 130 may change the value of the column detection addresses DET_CADD<0:4> to an initial value (for example, a minimum value) and increase the column detection addresses DET_RADD<0:9>.

In another embodiment, whenever a detection operation is completed, the detection counter 130 may increase the row detection addresses DET_RADD<0:9>. For example, when the detection operation is completed at the end value of the row detection addresses DET_RADD<0:9> (for example, a maximum value), the detection counter 130 may change the value of the row detection addresses DET_RADD<0:9> to an initial value (for example, a minimum value) and increase the row detection addresses DET_CADD<0:4>.

The flag signal generation unit 140 may toggle to a logic value of a flag signal FLAG in response to a refresh signal REFA in a detection period in which a detection operation is performed. When a detection period signal DET_OP indicating the detection period is activated, the flag signal generation unit 140 may toggle to the logic value of the flag signal FLAG in response to the refresh signal REFA. For example, when the flag signal FLAG has a first logic value (for example, low), the flag signal generation unit 140 may change the flag signal FLAG from the first logic value to a second logic value (for example, high) in response to the refresh signal REFA in the detection period. Furthermore, when the flag signal FLAG has the second logic value, the flag signal generation unit 140 may change the flag signal FLAG from the second logic value to the first logic value in response to the refresh signal REFA in the detection period. When the flag signal FLAG has the first logic value, the activation period of the detection period signal DET_OP may be substantially equal to the activation period of a second period signal SEC2. When the flag signal FLAG has the second logic value, the activation period of the detection period signal DET_OP may be substantially equal to the activation period of the first period signal SEC1.

The flag signal FLAG may have the first logic value to represent a first phase of the detection period in which a first sub-operation is performed in response to the activation of the refresh signal REFA. The flag signal FLAG may have the second logic value to represent a second phase of the detection period in which a second sub-operation is performed in response to the activation of the refresh signal REFA.

The period signal generation unit 150 may generate the first period signal SEC1, the second period signal SEC2, and/or the detection period signal DET_OP. The period signal generation unit 150 may sequentially activate the first period signal SEC1 and the second period signal SEC2 in the period in which the counting addresses CNT_ADD<0:9> and the row detection addresses DET_RADD<0:9> may be substantially equal. When the counting addresses CNT_ADD<0:9> and the row detection addresses DET_RADD<0:9> are substantially equal, the period signal generation unit 150 may activate the first period signal SEC1. In a state in which the first period signal SEC1 has been activated, the period signal generation unit 150 may deactivate the first period signal SEC1 and activate the second period signal SEC2 in response to the refresh signal REFA. In a state in which the second period signal SEC2 has been activated, the period signal generation unit 150 may deactivate the second period signal SEC2 in response to the refresh signal REFA. The period signal generation unit 150 may transfer the second period signal SEC2 as the detection period signal DET_OP in the first sub-operation and may transfer the first period signal SEC1 as the detection period signal DET_OP in the second sub-operation.

The error detection unit 160 may detect and correct errors of selected memory cells correspond ng to the row detection addresses DET_RADD<0:9> and the column detection addresses DET_CADD<0:4> among the plurality of memory cells MC of the cell array 110. The error detection unit 160 may latch data, which has been read from the selected memory cells, in response to the refresh signal REFA in the first phase of the detection period (the first logic value of FLAG and the activation of DET_OP). Furthermore, the error detection unit 160 may compare the data, which has been read from the selected memory cells, with the latched data and detect errors in response to the refresh signal REFA in the second phase of the detection period (the second logic value of FLAG and the activation of DET_OP).

When the read data and the latched data are substantially equal to each other, the error detection unit 160 may determine the states of the selected memory cells to be pass (no fail). When the read data and the latched data are different from each other, the error detection unit 160 may determine the states of the selected memory cells to be fail (failed). When the states of the selected memory cells are determined to be fail, the error detection unit 160 may control the column circuit 190 and the like such that the latched data may be written in the selected memory cells (a write-back operation). When no error is detected, the error detection unit 160 may deactivate (for example, low) a detection signal DET. When an error is detected, the error detection unit 160 may activate (for example, high) the detection signal DET.

The refresh control unit 170 may activate the refresh signal REFA whenever a refresh command REF is received.

The row circuit 180 may be a circuit for controlling active and precharge operations of word lines selected by row addresses RADD<0:9>, the counting addresses CNT_ADD<0:9>, or the row detection addresses DET_RADD<0:9>. The row circuit 180 may activate word lines corresponding to the row addresses RADD<0:9> in response to an active signal ACT activated when an active command is inputted, and may precharge the activated word lines in response to a precharge signal PRE activated when a precharge command is inputted. In the case in which the detection period signal DET_OP has been deactivated, the row circuit 180 may activate/precharge word lines corresponding to the counting addresses CNT_ADD<0:9> as the refresh signal REFA is activated. In the case in which the detection period signal DET_OP has been activated, the row circuit 180 may activate/precharge word lines corresponding to the row detection addresses DET_RADD<0:9> as the refresh signal REFA is activated.

The column circuit 190 may read data DATA from memory cells MC coupled to bit lines selected by column addresses CADD<0:4> in response to a read signal RD activated when a read command is inputted, and may write the data DATA to the memory cells MC in response to a write signal WT activated when a write command is inputted. The data DATA may be inputted/outputted to/from the cell array 110 through the column circuit 190.

When the flag signal FLAG has the first logic value and the detection period signal DET_OP has been activated, the column circuit 190 may transmit data of the memory cells corresponding to the row detection addresses DET_RADD<0:9> and the column detection addresses DET_CADD<0:4> to the error detection unit 160 in response to the refresh signal REFA. When the flag signal FLAG has the second logic value and the detection period signal DET_OP has been activated, the column circuit 190 may transmit the data of the memory cells corresponding to the row detection addresses DET_RADD<0:9 and the column detection addresses DET_CADD<0:4> to the error detection unit 160 in response to the REFA, and write data transmitted from the error detection unit 160 in the memory cells corresponding to the row detection addresses DET_RADD<0:9> and the column detection addresses DET_CADD<0:4> in response to the detection signal DET.

A reference numeral 101 indicates a plurality of lines for transferring various signals between the error detection unit 160 and the column circuit 190. In the embodiment of FIG. 1, four bit lines may correspond to respective values of the column addresses CADD<0:4> or the column detection addresses DET_CADD<0:4>.

When the counting addresses CNT_ADD<0:9> and the row detection addresses DET_RADD<0:9> are substantially equal, the memory device may perform a detection operation with respect to memory cells corresponding to the root detection addresses DET_RADD<0:9> and the column detection addresses DET_CADD<0:4>. Furthermore, the memory device may refresh word lines corresponding to the counting addresses CNT_ADD<0:9>. Accordingly, in a period in which the counting addresses CNT_ADD<0:9> and the row detection addresses DET_RADD<0:9> are substantially equal, detection and refresh operations are performed with respect to the memory cells corresponding to the row detection addresses DET_RADD<0:9> and the column detection addresses DET_CADD<0:4>.

At this time, the memory device may refresh word lines corresponding to the counting addresses CNT_ADD<0:9> and then perform the first sub-operation of the detection operation. The memory device may perform the second sub-operation of the detection operation and then refresh word lines corresponding to the counting addresses CNT_ADD<0:9>. Hence, the detection operation may be performed between consecutive refresh operations, that is, in a period from the time when a previous refresh operation has been completed to the time when a next refresh operation starts. Consequently, a refresh influence to the detection operation may be excluded, so that it is possible to enhance the accuracy of the detection operation.

Figure 2:
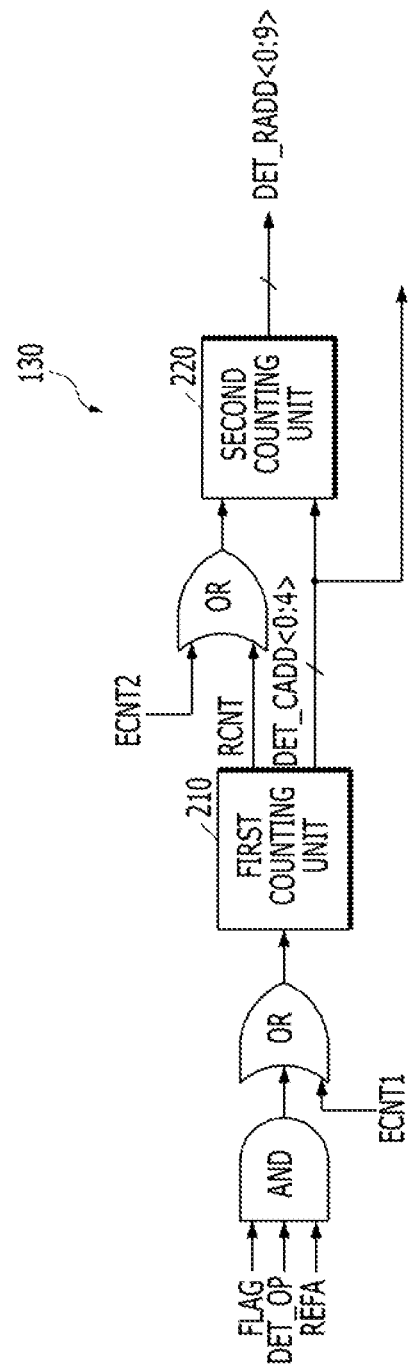
FIG. 2 is a configuration diagram of a detection counter for the memory device of FIG. 1, according to an embodiment of the present invention.

FIG. 2 is a configuration diagram of an example of a detection counter 130, that may be employed with a memory device according to an embodiment of the present invention.

Referring to FIG. 2 the detection counter 130 may include a first counting unit 210 and a second counting unit 220.

The first counting unit 210 may count the column detection addresses DET_CADD<0:4> (for example, increase the column detection addresses DET_CADD<0:4> by 1) whenever the detection operation is completed. When the detection operation is completed at the end value of the column detection addresses DET_CADD<0:4> (for example, 11111), the first counting unit 210 may initialize the column detection addresses DET_CADD<0:4> to an initial value (for example, 00000) and activate a row counting signal RCNT. To this end, in a state in which the flag signal FLAG has the second logic value and the detection period signal DET_OP has been activated, the first counting unit 210 may count the column detection addresses DET_CADD<0:4> as the refresh signal REFA is activated. Furthermore, in a state in which the flag signal FLAG has the second logic value, and the detection period signal DET_OP has been activated at the end value of the column detection addresses DET_CADD<0:4>, the first counting unit 210 may initialize the column detection addresses DET_CADD<0:4> to an initial value as the refresh signal REFA is activated. In addition, when a first external counting signal ECNT1 is activated, the first counting unit 210 may count the column detection addresses DET_CADD<0:4>. The first external counting signal ECNT1 may be a signal used for counting the column detection addresses DET_CADD<0:4> regardless of the completion of the detection operation.

The second counting unit 220 may count the row detection addresses DET_RADD<0:9> (for example, increase the row detection addresses DET_RADD<0:9> by 1) whenever the row counting signal RCNT is activated. When the row counting signal RCNT is activated at the end value of the row detection addresses DET_RADD<0:9> (for example, 1111111111), the second counting unit 220 may initialize the row detection addresses DET_RADD<0:9> to an initial value (for example, 0000000000). In addition, when a second external counting signal ECNT2 is activated, the second counting unit 220 may count the row detection addresses DET_RADD<0:9>. The second external counting signal ECNT2 may be a signal which is used when counting the row detection addresses DET_RADD<0:9> regardless of the initialization of the column detection addresses DET_CADD<0:4>.

Figure 3:
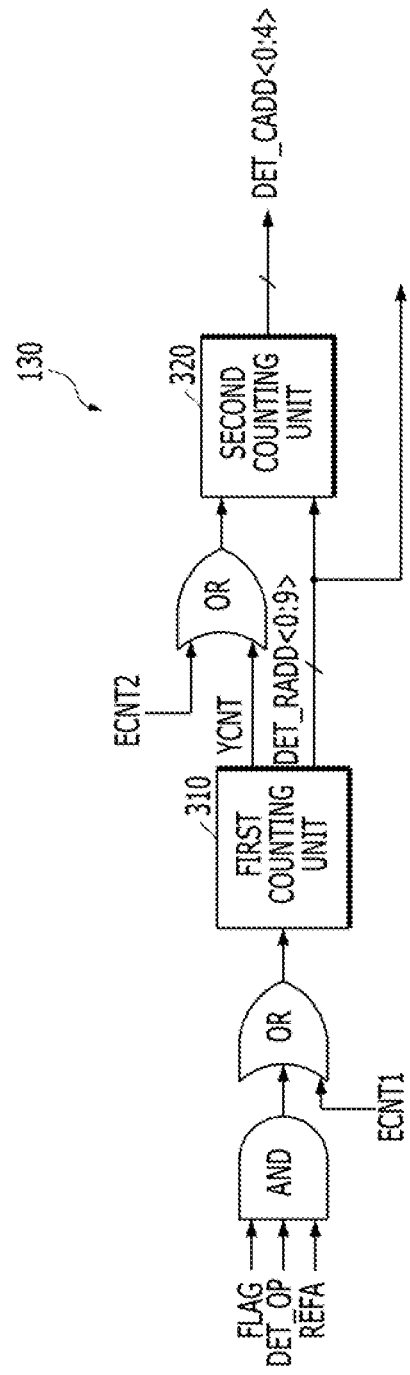
FIG. 3 is a configuration diagram of a detection counter for the memory device of FIG. 1, according to another embodiment of the present invention.

FIG. 3 is a configuration diagram of the detection counter 130 according to another embodiment of the present invention.

Referring to FIG. 3, the detection counter 130 may include a first counting unit 310 and a second counting unit 320.

The first counting unit 310 may count the row detection addresses DET_RADD<0:9> (for example, increase the row detection addresses DET_RADD<0:9> by 1) when the detection operation is completed. For example, when the detection operation is completed at the end value of the row detection addresses DET_RADD<0:9> (for example, 1111111111), the first counting unit 310 may initialize the row detection addresses DET_RADD<0:9> to an initial value (for example, 0000000000) and activate a column counting signal YCNT. To this end, in a state in which the flag signal FLAG has the second logic value and the detection period signal DET_OP has been activated, the first counting unit 310 may count the row detection addresses DET_RADD<0:9> as the refresh signal REFA is activated. Furthermore, in a state in which the flag signal FLAG has the second logic value, and the detection period signal DET_OP has been activated at the end value of the row detection addresses DET_RADD<0:9>, the first counting unit 310 may initialize the row detection signal DET_RADD<0:9> to an initial value as the refresh signal REFA is activated. In addition, when a first external counting signal ECNT1 is activated, the first counting unit 310 may count the row detection addresses DET_RADD<0:9>. The first external counting signal ECNT1 may be a signal used for counting the row detection addresses DET_RADD<0:9> regardless of the completion of the detection operation.

The second counting unit 320 may count the column detection addresses DET_CADD<0:4> (for example, increase the column detection addresses DET_CADD<0:4> by 1) whenever the column counting signal YCNT is activated. When the column counting signal YCNT is activated at the end value of the column detection addresses DET_CADD<0:4> (for example, 11111), the second counting unit 320 may initialize the column detection, addresses DET_CADD<0:4> to an initial value (for example, 00000). In addition, when a second external counting signal ECNT2 is activated, the second counting unit 320 may count the column detection addresses DET_CADD<0:4>. The second external counting signal ECNT2 may be a signal used for counting the column detection addresses DET_CADD<0:4> regardless of the initialization of the row detection addresses DET_RADD<0:9>.

Figure 4:
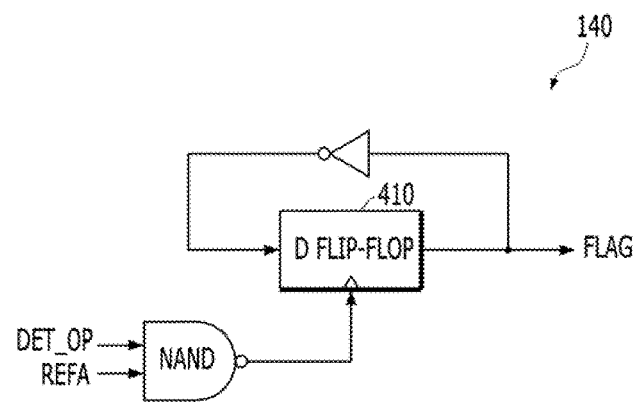
FIG. 4 is a configuration diagram of a flag signal generation unit shown for the memory device of FIG. 1, according to an embodiment of the present invention.

FIG. 4 is a configuration diagram of an example of a flag signal generation unit 140 that may be employed with a memory device, according to an embodiment of the present invention.

Referring to FIG. 4, the flag signal generation unit 140 may include a D flip-flop 410.

The D flip-flop 410 may output the flag signal FLAG to be low in an initial state. The flag signal FLAG outputted from the D flip-flop 410 may be inverted and may be inputted to the D flip-flop 410 again.

In the state in which the detection period signal DET_OP has been activated, the D flip-flop 410 may latch an inputted signal and output the flag signal FLAG as the refresh signal REFA is activated. Accordingly, when the detection period signal DET_OP and the refresh signal REFA are activated in the state in which the flag signal FLAG is low, the flag signal FLAG may be changed to high. When the detection period signal DET_OP and the refresh signal REFA are activated in the state in which the flag signal FLAG is high, the FLAG may be changed to low.

Figure 5:
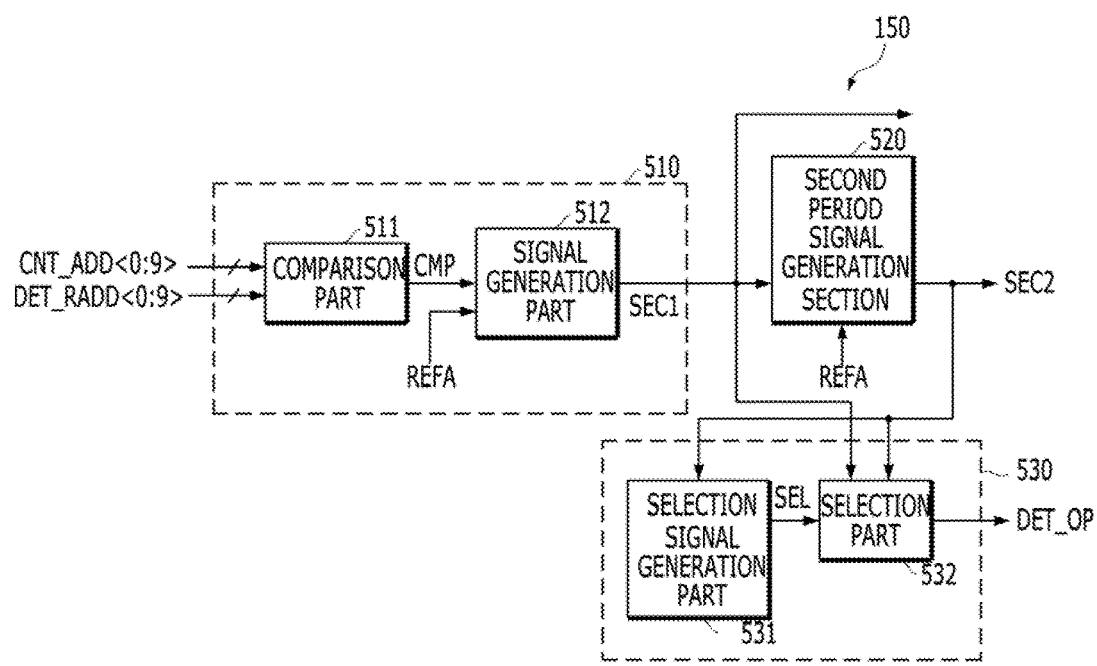
FIG. 5 is, a configuration diagram of a period signal generation unit for the memory device of FIG. 1, according to an embodiment of the present invention.

FIG. 5 is a configuration diagram of an example of a period signal generation unit 150 that may be employed with a memory device, according to an embodiment of the present invention.

Referring to FIG. 5, the period signal generation unit 150 may include a first period signal generation section 510, a second period signal generation section 520, and/or a detection period signal generation section 530.

The first period signal generation section 510 may include a comparison part 511 and a signal generation part 512. The comparison part 511 may compare the counting addresses CNT_ADD<0:9> with the row detection addresses DET_RADD<0:9>, deactivate (for example, low) a comparison signal CMP when the addresses are not substantially equal. The comparison part 511 may compare the counting addresses CNT_ADD<0:9> with the row detection addresses DET_RADD<0:9> and activate (for example, high) the comparison signal CMP when the addresses are substantially equal. The signal generation part 512 may activate the first period signal SEC1 when the comparison signal CMP is activated, and may deactivate the first period signal SEC1 in response to the refresh signal REFA in a state in which the comparison signal CMP has been activated.

The second period signal generation section 520 may latch and store the first period signal SEC1 when the refresh signal REFA is activated. The second period signal generation section 520 may output the latched value as the second period signal SEC2 when the refresh signal REFA is deactivated. Accordingly, in a state in which the first period signal SEC1 has been activated, the value of the SEC1 may be latched when the refresh signal REFA is activated. When the refresh signal REFA is deactivated, the latched value may be outputted and the second period signal SEC2 may be activated. In a state in which the first period signal SEC1 has been deactivated, the value of the SEC1 may be latched when the refresh signal REFA may be activated. When the refresh signal REFA is deactivated, the latched value may be outputted and the second period signal SEC2 may be deactivated. The second period signal generation section 520 may deactivate the second period signal SEC2 in an initialized state.

The detection period signal generation section 530 may include a selection signal generation part 531 and a selection part 532. The selection signal generation part 531 may generate a selection signal SEL which may change whenever the second period signal SEC2 has been activated and is deactivated (for example, at a falling edge). The selection signal generation part 531 may output an initial value 0 as a logic level of the selection signal SEL, and may change the logic value of the selection signal SEL from 0/1 to 1/0 at the falling edge of the second period signal SEC2. The selection part 532 may select the second period signal SEC2 and output the detection period signal DET_OP when the selection signal SEL is 0, and may select the first period signal SEC1 and output the detection period signal DET_OP when the selection signal SEL is 1.

Figure 6:
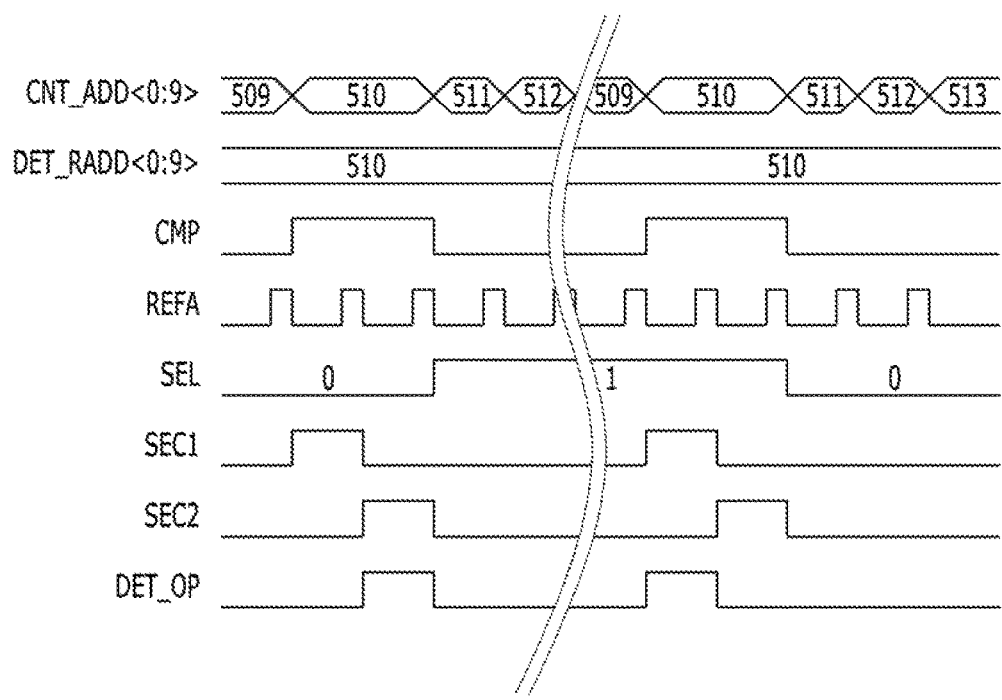
FIG. 6 is a timing diagram illustrating an operation of the period signal generation unit shown in FIG. 5, according to an embodiment of the present invention.

FIG. 6 is a diagram illustrating an operation of period signal generation unit 150, according to an embodiment of the present invention.

Referring to FIG. 6, when the counting addresses CNT_ADD<0:9> and the row detection addresses DETRADD<0:9> are different from each other, the comparison signal CMP may be substantially maintained to be low. When the counting addresses CNT_ADD<0:9> and the row detection addresses DETRADD<0:9> are substantially equal, the comparison signal CMP may be activated, and the first period signal SEC1 may be activated in response to the comparison signal CMP. In a state in which the comparison signal CMP has been activated, the first period signal SEC1 may be deactivated in response to the refresh signal REFA and the second period signal SEC2 may be activated. In a state in which the first period signal SEC1 has been deactivated, the second period signal SEC2 may be deactivated in response to the refresh signal REFA.

The selection signal SEL may toggle between 0 and 1 in response to the second period signal SEC2. When the selection signal SEL is 0, the second period signal SEC2 may be transferred as the detection period signal DET_OP. When the selection signal SEL is 1, the first period signal SEC1 may be transferred as the detection period signal DET_OP.

Figure 7:
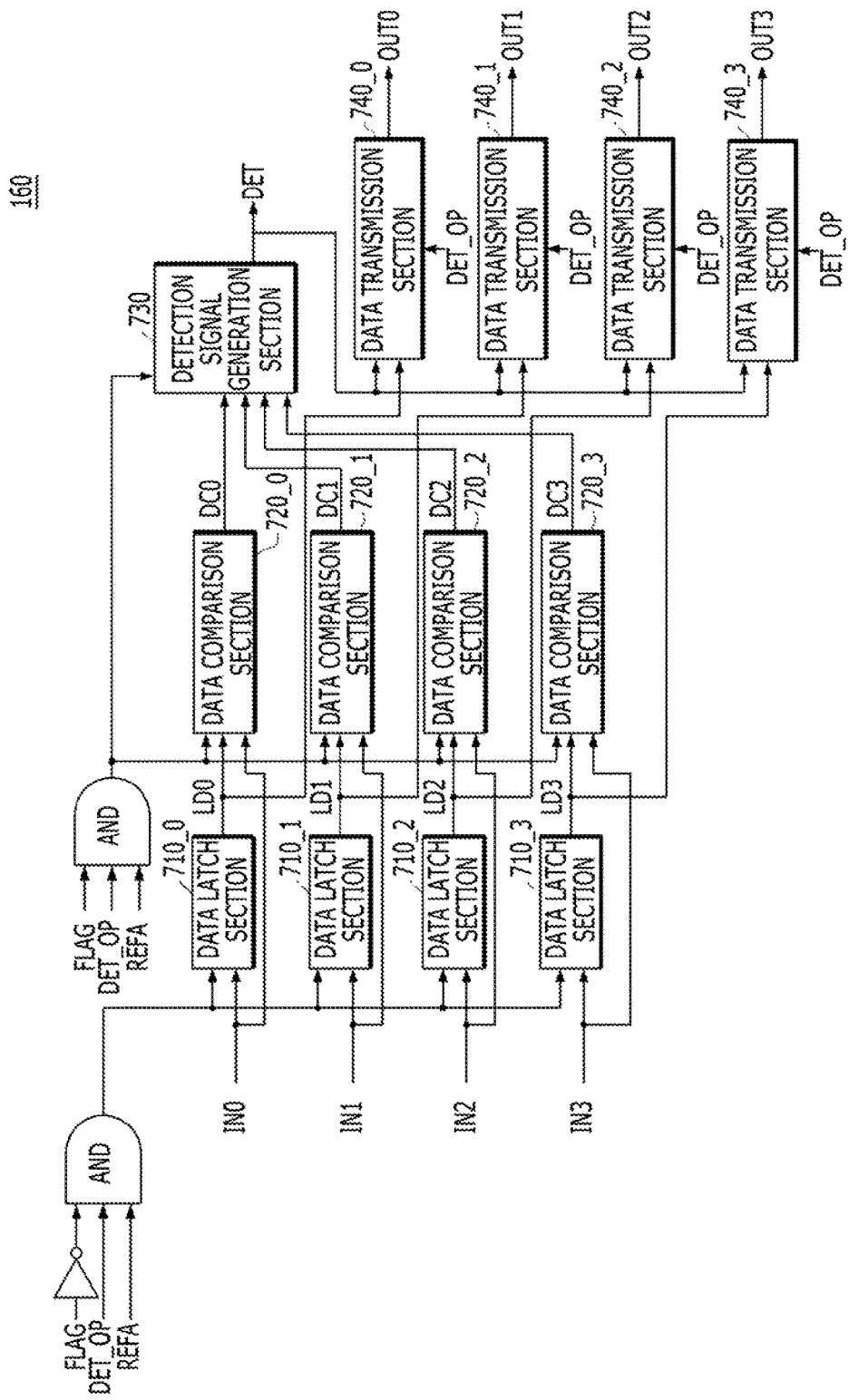
FIG. 7 is a configuration diagram of an error detection unit for the memory device of FIG. 1, according to an embodiment of the present invention.

FIG. 7 is a configuration diagram of error detection unit 160, according to an embodiment of the present invention.

Referring to FIG. 7, the error detection unit 160 may include a plurality of data latch sections 710_0 to 710_3, a plurality of data comparison sections 720_0 to 720_3, a detection signal generation section 730, and a plurality of data transmission sections 740_0 to 740_3. Reference numerals IN0 to IN3 denote input lines through which data is transferred to be inputted to the error detection unit 160, and reference numerals OUT0 to OUT3 denote output lines through which data is transferred to be outputted from the error detection unit 160. The lines 101 of FIG. 1 may include the input lines IN0 to IN3 and the output lines OUT0 to OUT3.

The plurality of data latch sections 710_0 to 710_3 respectively correspond to the input lines IN0 to IN3, and may latch data transferred to the respective input lines IN0 to In3 when the flag signal FLAG has the first logic value and the detection period signal DET_OP and the refresh signal REFA have been activated. Data of the input lines IN0 to IN3 may be data firstly read from selected memory cells MC. The plurality of data latch sections 710_0 to 710_3 may output the latched data (LD0 to LD3).

The plurality of data comparison sections 720_0 to 720_3 may output results DC0 to DC3, which have been obtained by comparing the latched data LD0 to LD3 outputted from the respective data latch sections 710_0 to 710_3 with data transferred to the respective input lines INC to IN3 when the flag signal FLAG has the second logic value and the detection period signal DET_OP and the refresh signal REFA have been activated. The data comparison sections 720_0 to 720_3 may deactivate the results DC0 to DC3 (for example, low) when the latched data LD0 to LD3 are substantially equal to data of the input lines IN0 to IN3. The data comparison sections 720_0 to 720_3 may activate the results DC0 to DC3 (for example, high) when the latched data LD0 to LD3 are different from the data of the input lines IN0 to IN3.

The detection signal generation section 730 may deactivate the detection signal DET when all the results DC0 to the DC3 are deactivated, that is, when the first read data (the latched data LD0 to LD3) is substantially equal to the second read data (the data of the input lines IN0 to IN3) in the case in which the flag signal FLAG has the second logic value and the detection period signal DET_OP and the refresh signal REFA have been activated. Furthermore, in the case in which the flag signal FLAG has the second logic value and the detection period signal DET_OP and the refresh signal REFA have been activated, the detection signal generation section 730 may activate the detection signal DET when one or more signals of the results DC0 to the DC3 are activated, that is, when the first read data is different from the secondly read data.

The plurality of data transmission sections 740_0 to 740_3 may respectively transfer the data LD0 to LD3, which have been outputted from the data latch sections 710_0 to 710_3 respectively, to the output lines OUT0 to OUT3 when the detection signal DET is activated in the case in which the flag signal FLAG has the second logic value and the detection period signal DET_OP has been activated. The data transferred to the output lines OUT0 to OUT3 may be written in the selected memory cells MC via the column circuit 190. At this time, a write-back operation may be performed after a pass/fail determination of the selected memory cells is completed.

Figure 8:
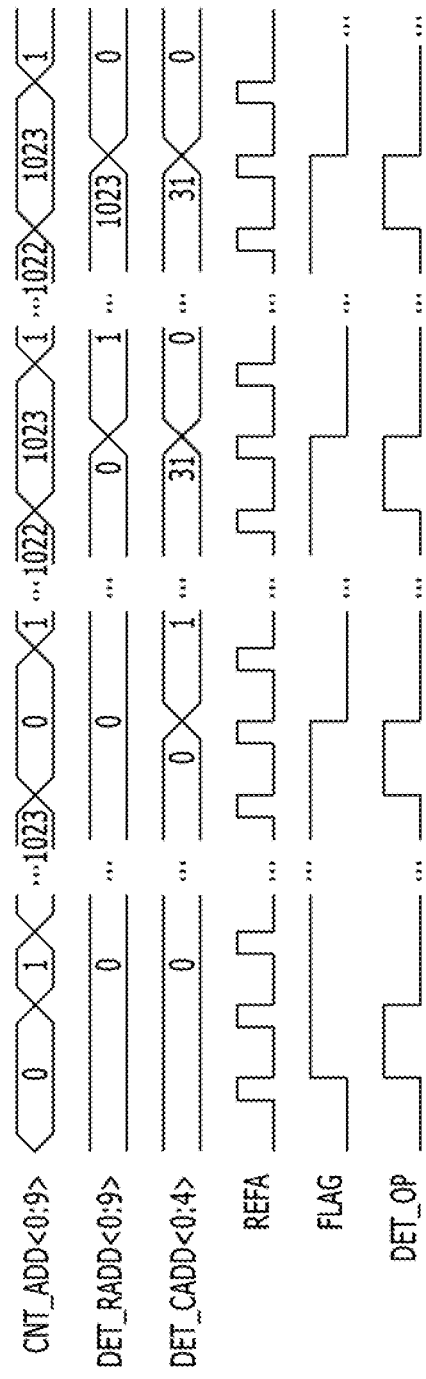
FIG. 8 is a timing diagram illustrating an operation of the memory device of FIG. 1 according to an embodiment of the present invention.

FIG. 8 is a timing diagram illustrating an operation of the memory device of FIG. 1, according to an embodiment of the present invention. FIG. 8 is a diagram illustrating the operation of the memory device when the detection counter 130 according to the embodiment of FIG. 2 is used. Hereinafter, the counting addresses CNT_ADD<0:9>, the row detection addresses DET_RADD<0:9> and the column detection addresses DET_CADD<0:4> are expressed by decimal numbers.

Referring to FIG. 8, in the memory device, all the counting addresses CNT_ADD<0:9>, the row detection addresses DET_RADD<0:9>, and the column detection addresses DET_CADD<0:4> are 0 in an initial state. The flag signal FLAG is low in an initial state.

In a period in which the flag signal FLAG is low and the counting addresses CNT_ADD<0:9> and the row detection addresses DET_RADD<0:9> are 0, a refresh operation of a word line corresponding to the counting addresses CNT_ADD<0:9>=0 may be performed in response to the refresh signal REFA. At this time, the counting addresses CNT_ADD<0:9> are not increased. The detection period signal DET_OP may be activated at the falling edge of the refresh signal REFA. And then, the first-sub operations may be performed for memory cells corresponding to the row detection addresses DET_RADD<0:9>=0 and the column detection addresses DET_CADD<0:4>=0 in response to the refresh signal REFA. At this time, the counting addresses CNT_ADD<0:9> may be increased from 0 to 1.

Since the counting addresses CNT_ADD<0:9> and the row detection addresses DET_RADD<0:9> are different in a period of the counting addresses CNT_ADD<0:9> from 1 to 1023, no detection operation is performed. When the counting addresses CNT_ADD<0:9> are counted from 1023 to 0 and are substantially equal to the row detection addresses DET_RADD<0:9> again, the detection period signal DET_OP is activated and the second-sub operations are performed for the memory cells corresponding to the to row detection addresses DET_RADD<0:9>=0 and the column detection addresses DET_CADD<0:4>=0 in response to the refresh signal REFA. When the second-sub operations are completed, the column detection addresses DET_CADD<0:4> are counted from 0 to 1. At this time, the counting addresses CNT_ADD<0:9> are not increased. Then, a refresh operation of a word line is performed in response to the refresh signal REFA, and the counting addresses CNT_ADD<0:9> may be increased from 0 to 1.

After the detection operations of memory cells corresponding to the row detection addresses DET_RADD<0:9>=0 and the column detection addresses DET_CADD<0:4>=1 to 31 are sequentially performed, the row detection addresses DET_RADD<0:9> may be increased from 0 to 1. The detection operations of memory cells coupled to word lines corresponding to the row detection addresses DET_RADD<0:9>=1 to 1023 may be performed according to processes which are similar to the processes described above. When the detection operations of memory cells corresponding to the row and column detection addresses DET_RADD<0:9>=1023, DET_CADD<0:4=31 are completed detection operations may be repeated from the memory cells corresponding to the row and column detection addresses DET_RADD<0:9>=0, DET_CADD<0:4>=0.

Figure 9:
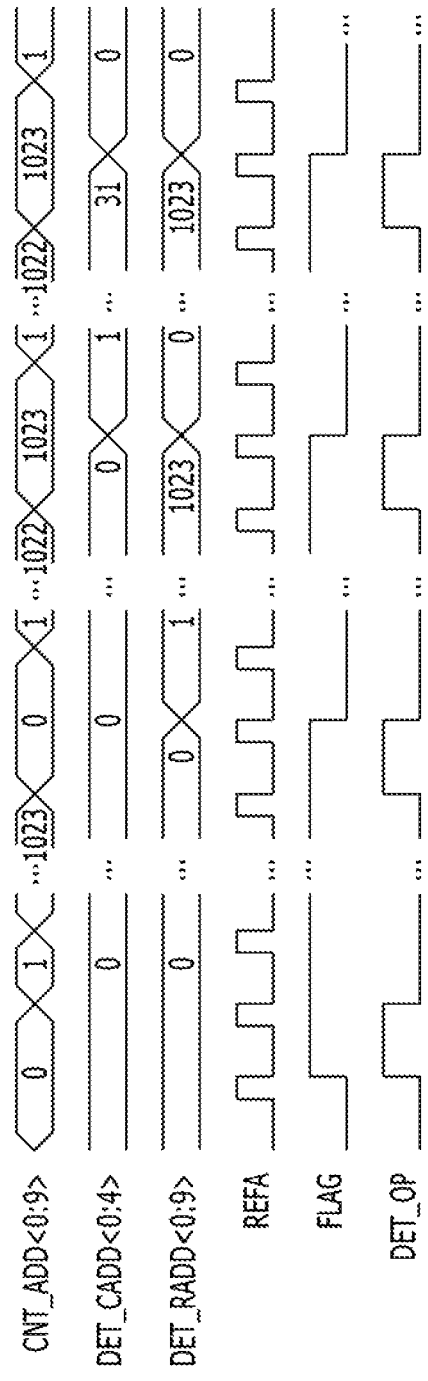
FIG. 9 is a timing diagram illustrating an operation of the memory device of FIG. 1, according to an embodiment of the present invention.

FIG. 9 is a diagram illustrating the operation of a memory device employing a detection counter 130 according to the embodiment of FIG. 3 is used. Hereinafter, the counting addresses CNT_ADD<0:9>, the row detection addresses DET_RADD<0:9>, and the column detection addresses DET_CADD<0:4> are expressed by decimal numbers.

Referring to FIG. 9, in the memory device, all the counting addresses CNT_ADD<0:9> the row detection addresses DET_RADD<0:9>, and the column detection addresses DET_CADD 0:4> are 0 in an initial, state. The flag signal FLAG is low in an initial state.

In a period in which the flag signal FLAG is low and the counting addresses CNT_ADD<0:9 > and the row detection addresses DET_RADD<0:9> are 0, a refresh operation of a word line corresponding to the counting addresses CNT_ADD<0:9>=0 may be performed in response to the refresh signal REFA. At this time, the counting addresses CNT_ADD<0:9> are not counted, i.e., they are not increased. The detection period signal DET_OP may be activated at the falling edge of the refresh signal REFA. And then, the first-sub operations may be performed for memory cells corresponding to the row detection addresses DET_RADD<0:9>=0 and the column detection addresses DET_CADD<0.4>=0 in response to the refresh signal REFA. At this time, the counting addresses CNT_ADD<0:9> may be counted, i.e. increased from 0 to 1.

Since the counting addresses CNT_ADD<0:9> and the row detection addresses DET_RADD<0:9> are different in a period of the counting addresses CNT_ADD<0:9> from 1 to 1023, no detection operation is performed. When the counting addresses CNT_ADD<0:9> are counted from 1023 to 0 and are substantially equal to the row detection addresses DET_RADD<0:9> again, the detection period signal DET_OP is activated and the second-sub operations are performed for the memory cells corresponding to the row detection addresses DET_RADD<0:9>=0 and the column detection addresses DET_CADD<0:4>=0 in response to the refresh signal REFA. When the second-sub operations are completed, the row detection addresses DET_RADD<0:9> are counted from 0 to 1 At this time, the counting addresses CNT_ADD<0:9> are not counted. Then, a refresh operation of a word line is performed in response to the refresh signal REFA, and the counting addresses CNT_ADD<0:9> is counted from 0 to 1.

After the detection operations of memory cells corresponding to the row detection addresses DET_RADD<0:9>=1 to 1023 and the column detection addresses DET_CADD<0:4>=0 are sequentially performed, the column detection addresses DET_CADD<0:4> may be counted from 0 to 1. The detection operations of memory cells coupled to word lines corresponding to the column detection addresses DET_CADD<0:4>=1 to 31 are performed in processes similar to the above. When the detection operations of memory cells corresponding to the row detection addresses DET_RADD<0:9>=1023 and the column detection addresses DET_CADD<0:4>=31 are completed, detection operations may be repeated from the memory cells corresponding to the row detection addresses DET_RADD<0:9>=0 and the column detection addresses DET_CADD<0:4>=0.

Although various embodiments have been described for illustrative purposes, it will be apparent to those skilled in the art that various may change and modifications may be made without departing from the spirit and scope of the invention as defined in the following claims.

What is claimed is:

1. A memory device comprising:
   a plurality of memory cells; and
   an error detection unit suitable for latching first read data of one or more memory cells selected from the plurality of memory cells after refreshing the selected memory cells, in a first phase, and suitable for detecting errors of the selected memory cells before refreshing the selected memory cells, in a second phase,
   wherein when a refresh command is received, memory cells corresponding to a refresh address among the plurality of memory cells are controlled to be refreshed
   wherein, when the refresh address is substantially equal to a row detection address in the first phase, the error detection unit latches data of memory cells corresponding to the row detection address and a column detection address after the memory cells corresponding to the refresh address are refreshed, and
   when the refresh address is substantially equal to the row detection address in the second phase, the error detection unit compares the data of the memory cells corresponding to the row detection address and the column detection address with the latched data.

2. The memory device of claim 1, wherein the error detection unit compares the latched data with the second read data for detecting an error thereof, and determines that at least one memory cell to be a fail when the latched data is not substantially the same with the second read data.

3. The memory device of claim 2, wherein for the at least one memory cell determined to be a fail, the error detection writes the latched data to the at least one memory cell.

4. The memory device of claim 1, wherein the error detection unit sequentially selects one or more memory cells from the plurality of memory cells for detecting an error thereof.

5. The memory device of claim 1:
   wherein the column detection address is changed when an operation for detecting the errors of the one or more selected memory cells is completed, and the row detection address is changed when the column detection address is changed from an end value to a start value; and wherein the error detection unit detects errors of the memory cells corresponding to the row detection address and the column detection address among the plurality of memory cells.

6. The memory device of claim 1;
wherein the row detection address is changed when an operation for detecting the errors of the selected memory cells is completed, and the column detection address is changed when the row detection address is changed from an end value to a start value; and
wherein the error detection unit detects errors of the memory cells corresponding to the row detection address and the column detection address among the plurality of memory cells.

7. A memory device comprising:
a plurality of memory cells;
a refresh counter suitable for generating a refresh address;
a detection counter suitable for generating row and column detection addresses;
a period signal generation unit suitable for sequentially activating first and second period signals in a period when the refresh address and the row detection address are substantially equal to each other; and
an error detection unit suitable for latching first read data of first memory cells corresponding to the row and column detection addresses among the plurality of memory cells in response to a refresh command after the memory cells corresponding to the refresh address are refreshed when the second period signal is activated in a first phase, and
suitable for detecting errors of the first memory cells in response to the refresh command using second read data of the first memory cells by comparing the first read data latched in the first phase with the second read data when the first period signal is activated in a second phase,
wherein when the refresh command is received, memory cells corresponding to the refresh address, among the plurality of memory cells, are controlled to be refreshed.

8. The memory device of claim 7, wherein the error detection unit compares the first read data latched in the first phase with the second read data used in the second phase to detect the errors of the first memory cells, determines the first memory cells to be pass when the first read data is substantially equal to the second read data, and determines the first memory cells to be fail when the first read data is different from the second read data.

9. The memory device of claim 8, wherein, when the first memory cells are determined to be fail, the error detection unit controls the first read data latched in the first phase to be written in the first memory cells.

10. The memory device of claim 7, further comprising:
a refresh control unit suitable for controlling memory cells coupled to a word line corresponding to the refresh address, among the plurality of memory cells, to be refreshed.

11. The memory device of claim 7, further comprising:
a flag signal generation unit suitable for generating a flag signal, changes the flag signal having a first logic value to a second logic value in response to the refresh command in a period when the second period signal activated, and changes the flag signal having the second logic value to the first logic value in response to the refresh command in a period when the first period signal is activated.

12. The memory device of claim 11, wherein the detection counter changes the column detection address when the refresh command is received in a period when an address change signal is activated or when the flag signal has the second logic value and the second period signal is activated, and changes the column detection address to an initial value and changes the row detection address when the column detection address has an end value.

13. The memory device of claim 11, wherein the detection counter changes the row detection address when the refresh command is received in a period when an address change signal is activated or when the flag signal has the second logic value and the second period signal is activated, and changes the row detection address to an initial value and changes the column detection address when the row detection address has an end value.

14. The memory device of claim 7, wherein the refresh counter counts the refresh address in response to the refresh command out of an activation period of the first period signal when the refresh address and the row detection address are substantially equal to each other.

* * * * *